United States Patent [19]

Ruckenbauer et al.

[11] Patent Number: 4,467,271
[45] Date of Patent: Aug. 21, 1984

[54] TEST APPARATUS FOR DETERMINATION OF VIBRATION CHARACTERISTICS OF PIEZOELECTRIC TRANSDUCERS

[75] Inventors: Friedrich Ruckenbauer; Peter Krempl, both of Graz, Austria

[73] Assignee: Hans List, Graz, Austria

[21] Appl. No.: 340,882

[22] Filed: Jan. 19, 1982

[30] Foreign Application Priority Data

Feb. 10, 1981 [AT] Austria .................................. 613/81

[51] Int. Cl.³ .......................................... G01R 29/22
[52] U.S. Cl. .................................... 324/56; 324/57 Q
[58] Field of Search ........................... 324/56, 57 Q

[56] References Cited

U.S. PATENT DOCUMENTS 3,832,630 8/1974 Micol .................................. 324/56

FOREIGN PATENT DOCUMENTS 756318 8/1980 U.S.S.R. ............................. 324/56

Primary Examiner—Stanley T. Krawczewicz
Assistant Examiner—Jose M. Solis
Attorney, Agent, or Firm—Watson Cole Grindle & Watson

[57] ABSTRACT

An AC generator may be connected to the signal leads of a piezoelectric transducer in order to induce mechanical vibrations in the transducer via the inverse piezoelectric effect. For determination of the vibration characteristics of the transducer provisions are made for a subtraction unit, whose one input is fed with the excitation signal of the AC generator while the other input is connected to the signal leads of the transducer. An evaluation unit is connected to the output of the subtraction unit; it displays and processes the measurement signal derived as the difference of the response signal of the transducer and a signal proportional to the excitation signal.

10 Claims, 5 Drawing Figures

TEST APPARATUS FOR DETERMINATION OF VIBRATION CHARACTERISTICS OF PIEZOELECTRIC TRANSDUCERS

BACKGROUND OF THE INVENTION

The present invention relates to a measuring set-up for the determination of the vibration characteristics of transducers or transducer systems with piezoelectric measuring elements, comprising an AC generator which may be connected to the signal leads of the transducer to be tested in order to induce mechanical vibrations of the measuring element due to the inverse piezoelectric effect, and a measuring system for the measurement and evaluation of these vibrations.

DESCRIPTION OF THE PRIOR ART

The vibration characteristics of piezoelectric transducers which are commonly used to transform mechanical changes of state, e.g. pressure changes, accelerations etc. into electrical signals, can be determined by various known methods and testing arrangements. In the simplest case, mechanical shock excitation of the measuring elements resulting from the impact of a pellet is used to induce slightly damped vibrations in the measuring elements, which are evaluated by means of a storage oscilloscope connected to the signal leads of the transducer to be tested. This known method suffers from the disadvantage that the mechanical shock will only induce a damped oscillation in one characteristic frequency of the measuring element, which will not permit a comprehensive appraisal of the vibration behaviour of the transducer.

Other known testing set-ups for the determination of the vibration behaviour of piezoelectric transducers are based on similar principles, i.e. exciting vibration in the measuring elements by means of shock waves—generated e.g. in a shock tube—or by sudden pressure changes of a pneumatic of hydraulic origin. In all cases mentioned, the response signal generated by the piezoelectric effect is evaluated.

These methods and test arrangements are being used mainly for non-stationary measurements, as e.g. in ballistics; due to the limited excitation possibilities they do not permit a comprehensive appraisal of the vibration characteristics of the transducers tested, however.

Other known testing arrangements generate sinusoidal oscillations via electrodynamic oscillators, these oscillations being held at constant values by a measuring and control system, and being imparted to the transducer to be measured by a jolting table. This method is mainly used for the measurement of accelerometers of a low characteristic frequency, since electrodynamic oscillators will only cover a narrow frequency range (up to a few KHz) and the test apparatus is quite costly. Finally, there is a known method which utilizes the inverse piezoelectric effect in order to excite mechanical vibrations in the piezoelectric measuring element of a transducer, and which measures these vibrations by means of capacitor external to the transducer to be tested, one of whose electrodes is directly linked with the oscillating measuring elements. In piezoelectric pressure transducers whose sensitive elements are directly linked with a membrane exposed to the pressure to be measured, this membrane itself will usually be taken as one of the electrodes of the evaluation capacitor. A similar arrangement is based on the fact that vibrations in the piezoelectric measuring elements of the transducers are directly excited by electrostatic attraction due to a voltage applied between an external electrode and the transducer membrane. Since these electrostatic attraction forces are extremely small, the resulting piezoelectric signals to be evaluated tend to be very small as well, thus making the method applicable to transducers with a high force or pressure sensitivity only. Apart from this, the latter two methods and arrangements suffer from the serious drawback that the transducers to be measured must be firmly held in a very stable frame in order to effectuate parallel adjustment of the external electrode with the required precision. The transducer or its membrane must furthermore be polished most carefully to permit the application of the necessary high AC or DC voltage.

A common disadvantage of all the arrangements mentioned thus far lies in the fact that the vibration characteristics of the transducer cannot be measured with the transducer being mounted in its usual operational position. This makes it impossible to take into account the effects of environmental influences upon the transducer, which to a varying degree are part of every measurement task. Such environmental influences may e.g. arise from the fact that the transducer or rather its housing is fitted into a test bore in the wall of a pressure chamber and is therefore subject to mechanical or thermic stresses, which in adverse cases may directly act e.g. on the bias of the measuring elements themselves or on other variables which have a bearing on the vibrational behaviour of the transducer.

SUMMARY OF THE INVENTION

It is an object of the present invention to improve a test apparatus of the aforementioned type in such a way as to permit measuring of the vibration characteristics of the transducer by utilizing only the signal leads providing for ordinary operation, with the transducer remaining in its usual operational position.

This aim is attained by providing the measurement system with a subtraction unit whose one input is fed with the excitation signal of the AC generator while the other input is connected to the signal leads of the transducer, and by further providing an evaluation unit, which is connected to the output of the subtraction unit and will display and process the measurement signal derived as the difference of the response signal of the transducer and a signal proportional to the excitation signal. The mechanical oscillations of the measuring element excited by the AC generator connected to the ordinary signal leads of the transucder, will in turn produce a response signal via the normal piezoelectric effect, which will be mixed with the excitation signal. Consequently, the subtraction unit may be used to subtract that part of the mix stemming from the excitation signal, thus making available the measurement signal describing the vibrational characteristics of the transducer tested, which has the same frequency as the excitation signal supplied by the AC generator. The following evaluation unit may be used to transform by standard rectifying techniques the measurement signal into an amplitude-proportional DC signal, and, possibly, to determine the phase of the measurement signal relative to the excitation signal by means of a phase-measuring circuit. These values, which determine the measurement signal in a unique manner, may then be displayed in an analog or digital manner and may be recorded or stored in a storage device for further processing. A test apparatus according to the invention will thus make it possible to study the vibrational behavior of a transducer fitted into a test bore of the wall of a pressure chamber e.g., by simply connecting the signal leads of the transducer to the measuring system. This will permit registering any influence of the normal operating environment on the function and especially on the vibration characteristics of the transducer, thus making tests particularly practice-oriented.

An enhanced version of this invention provides the measuring system with its own impedance chain, with the connected transducer forming part of this chain and the response signal of the transducer being derived from the other part or one of the other parts of the impedance chain. The phase-shifting components of the measuring system, i.e. the cable capacitances, input capacitances of the subtraction unit, stray capacitances in the transducer and the capacitance of the measuring element itself may be compensated by means of the impedance chain. According to another proposal of the present invention, it will be particularly advantageous for the impedance chain to contain an adjustable element for taking into account the differing characteristics of various transducers or transudcer systems.

In the case of a test apparatus in which one signal lead of the transducer to be measured is connected to housing-ground, a further proposal of the present invention suggests placing the transducer to be measured in the grounded part of the unilaterally grounded impedance network which consists either of phase-shifting elements only or of a combination of phase-shifting and purely resistive elements. It permits the transducer to be measured to be connected to any grounded measuring set-up without further preparations. This is of particular advantage for piezoelectric transducers with only one signal lead (charge pick-up lead), where the other electrode of the measuring element is connected to the transducer housing.

If the transducer to be tested is built with two signal leads, a test apparatus is configured according to the present invention in such a way as to place the transducer in the voltage source side, e.g., between voltage source and mid-point, of the unilaterally grounded voltage divider circuit, thus forming a so-called admittance network, where the cable capacitances will present a capacitive reactance against ground and may be taken as part of the impedance between mid-point and ground, leaving ony capacitances and interior resistances of the transducer to be explicitly dealt with. Since the cable capacitances of short cables have the same order of magnitude as the capacitance of the measuring element, the interior resistance and the input capacitance against ground of the subtraction unit will essentially determine the measurement sensitivity. Since e.g. field-effect transistors have an input resistance of $10^{14}$ ohm approx. and an input capacitance of 30 pF approx., this will permit the building of highly sensitive measurement systems even for extremely small piezoelectric measuring elements and transducers.

Transducers with one signal lead only may alo be measured by means of an admittance network as described above. In this case the excitation signal of the AC generator is applied to the transducer housing, while the response signal is taken from the signal lead; a compensation resistor must be provided.

A further improved variant of the present invention will incorporate into the subtraction unit a differential amplifier or an operational amplifier with a differentiating input. The output of this amplifier will directly represent the electric reaction of the piezoelectric element as an AC signal of the same frequency as the excitation signal, provided that the excitation signal has been separated properly from the response signal, which will depend on the common-mode suppression characteristics of the amplifier.

A further enhancement of this invention envisages yet another adjustable voltage divider circuit connected to the subtraction unit and supplying a subtraction voltage which may be used to compensate the electric reaction of the excitation signal due to the parallel resistances of the transducer or the connecting cable. The measurement signal proper, i.e. the electric reaction of the transducer is extracted from the response signal in such a way that those components of the excitation signal arising from parallel resistances in the transducer or in the connecting cable are subtracted from the response signal. These parallel resistances may be measured at frequencies of the excitation signal, which do not correspond to any resonances of the transducer or the whole transducer system, and the excitation signal component of the response signal may be calculated from this. Precision compensation of these parallel resistances may also be achieved by adjusting the phase angle of the response signal to zero or to small negative values, or by adjusting the additional voltage divider circuit using the symmetry of a resonance curve of the response signal. If the additional voltage divider circuit is not precisely adjusted the phase of the measurement signal may be evaluated as a measurement variable.

A further enhanced variation of the present invention suggests that the additional voltage divider circuit supplying the subtraction voltage be roughly adjustable to a series of identical transducers, that both the excitation signal and the response signal be digitized by means of an analog/digital converter, and that precise compensation of the reaction of the excitation signal be carried out by digital signal processing. As a consequence, the—at least partial—use of an analog subtraction technique for eliminating the excitation signal will permit a rough adjustment of the measurement system to a range of transducers, which will reduce the resolution requirements placed on the AD-converter used for precision adjustment. This precision adjustment may then be performed by digital signal processing methods.

In another variant of the present invention the subtraction unit may be configured as a bridge circuit. In this case the transducer to be tested and another identical transducer are each placed in a branch of the bridge network such that the electrical reaction of the excitation signal is compensated. This method will permit varying of the environmental conditions of the transducer to be tested in order to simulate various operational conditions. The vibration characteristics of the transducer as functions of changing external influences, e.g. pressure, temperature, may thus be determined in a simple manner. Since the environmental conditions for the second, identical transducer in the bridge network are being kept constant, the measurement signal obtained will portray the changes in vibrational behaviour with environmental changes of the transducer to be tested in a significant manner.

A further enhancement of this invention suggests the use of the charge amplifier which is normally used during ordinary operation of the transducer, as part of the subtraction unit of the test apparatus. Thus an essential component of the operational measurement system will simultaneously be utilized as part of the test set-up for the transducer, which will reduce the cost of the testing system on the one hand, while greatly simplifying periodic testing of the vibration characteristics of the transducer during normal operation on the other hand. A changeover switch contained in the test set-up may be used to change the function of the amplifier and thus to alternate between normal operation and test mode.

Besides, it will be of particular advantage to place the measurement system in the immediate vicinity of the transducer to be tested, or—even better—to integrate it with the transducer, as this will eliminate the adverse effects of lengthy connecting cables on the accuracy of measurement.

Finally, the present invention also envisages the use of a micro-processor or micro-computer in the measurement system in order to control the test procedure and/or for signal processing purposes, thereby simplifying the entire procedure.

DESCRIPTION OF THE DRAWINGS

Following is a more detailed description of the present invention with reference to exemplary embodiments as illustrated by the enclosed drawings, wherein.

DESCRIPTION OF THE PREFERRED EMBODIMENTS

Figure 1:
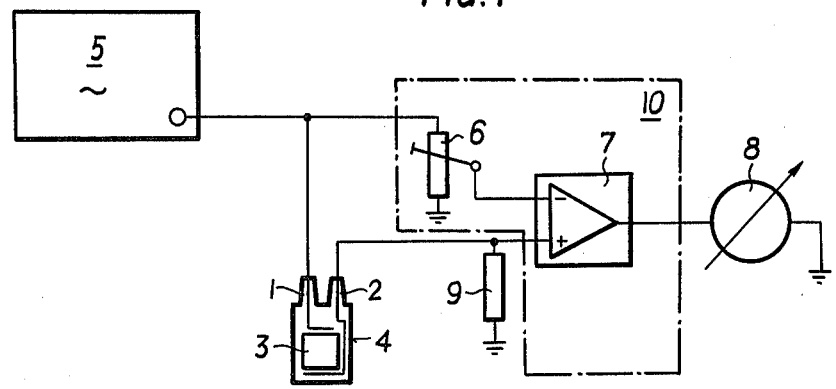
FIG. 1 shows a variant of the present invention, incorporating a transducer with two signal leads, in the form of an admittance network.

The test set-up of FIG. 1 shows a transducer to be measured with two signal leads 1 and 2, the piezoelectric measuring element 3 being insulated against the transducer housing 4. This apparatus comprises a frequency-variable sinewave generator 5 with low non-linear distortion, a phase-variable impedance 6 and a differential amplifier 7 with high-resistance inputs and excellent common-mode suppression. The output of the differential amplifier 7 is connected to an AC voltmeter 8 displaying the measurement signal. The resistor 9 compensates the input current and, together with the input resistance of the non-inverting input of the differential amplifier and the piezoelectric element, forms a voltage divider circuit from which the response signal of the piezoelectric sensor is derived. The subtraction unit 10 compensates the excitation signal component of the response signal, the variable impedance 6 being adjusted so as to supply the value of the excitation signal to be subtracted, and the differential amplifier 7 performing the subtraction. The subtraction unit as such is indicated by a broken line and is designated 10.

Figure 2:
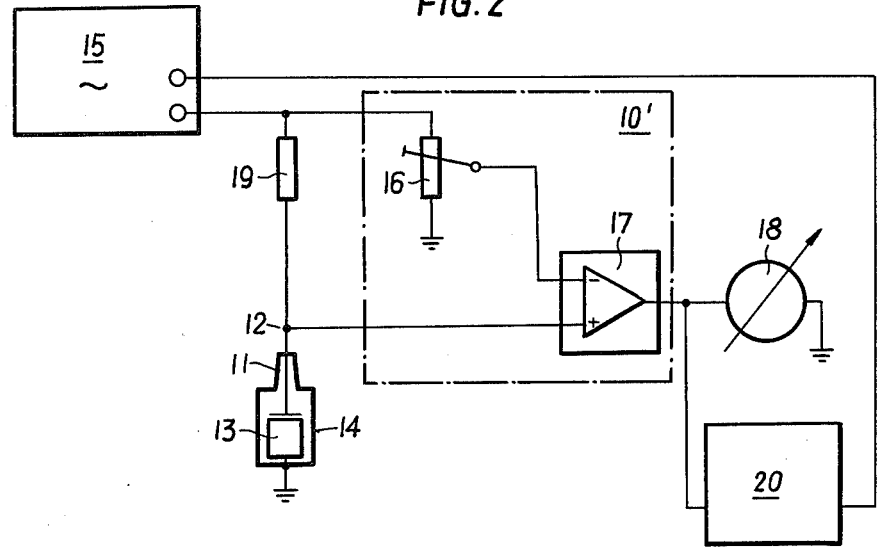
FIG. 2 shows a variant of the set-up for a transducer with one signal lead in the form of an impedance network.

FIG. 2 shows a test apparatus for a transducer with one signal lead 11 only, the other electrode of the piezoelectric measuring element 13 being connected to the housing 14 of the transducer. The response signal of the transducer is taken from point 12, where the resistor 19 is connected to the transducer. By means of the differential amplifier 17 a fraction of the excitation signal, which can be adjusted via the potentiometer 16, is subtracted from the response signal. At the output of the differential amplifier 17 the measurement signal may be displayed by an AC voltmeter 18 or fed into a recording device 20. The subtraction unit again is indicated by a broken line and is designated 10'.

Figure 3:
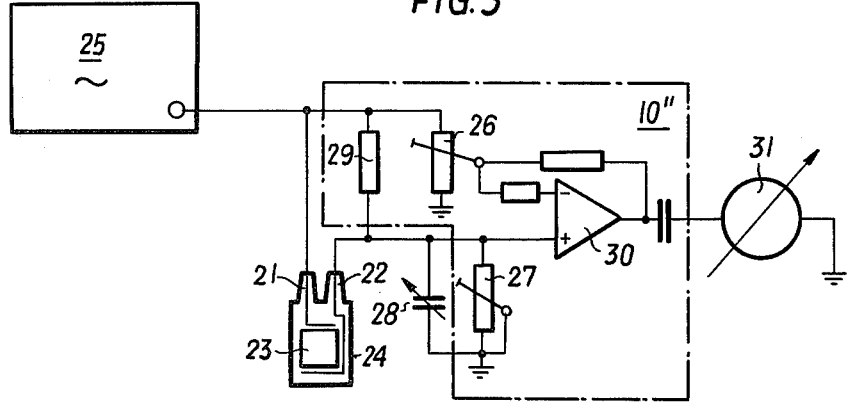
FIG. 3 shows another variant of the present invention in the form of a bridge circuit.

FIG. 3 shows a test set-up for a two-lead transducer (21, 22) using an admittance circuit. An impedance network consisting of the variable impedances 27 and 28 and of impedance 29, and a reference potentiometer 26 are also shown. The resistors 27 and 29 compensate ohmic losses in the cables and in the transducer as well as the input impedance of the differential amplifier. They also help to improve the common-mode suppression of the operational amplifier. The variable capacitor 28 compensates the cable capacitances and stray-capacitances of the transducer. The operational amplifier 30 determines the elctric reaction of the transducer by subtracting a fraction of the excitation signal derived from potentiometer 26 from the response signal of the transducer. In the case of transducers with one signal lead only, the excitation signal of the AC generator 25 should be applied to the housing 24 of the transducer, and the signal lead should be connected to parts 27, 28, 29 and to the non-inverting input of the operational amplifier 30. The subtraction unit is again indicated by a broken line and designated 10". The output of the subtraction unit 10" again is connected to an AC voltmeter 31 for displaying the amplitude of the measurement signal.

Figure 4:
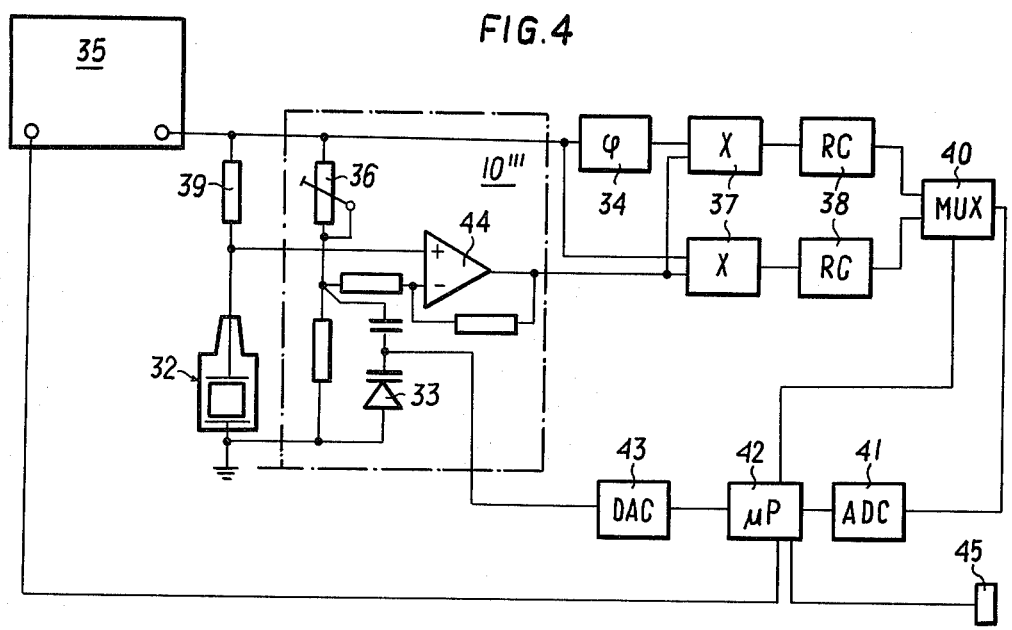
FIG. 4 shows another variant of this invention with a synchronous rectifier.

FIG. 4 shows a test arrangement with a controllable AC generator 35 and an impedance network comprising the potentiometer 36 and the variable capacitance diode 33. By means of this impedance network the phase-shift of the subtraction signal to be subtracted from the response signal of the transducer 32 to be tested, may be adjusted via a micro-processor 42 and an analog/digital converter 43. The measurement signal is obtained from the phase-shifting impedance 39, which is connected to the signal lead of the transducer 32. By subtracting the response signal of the transducer from the excitation signal by means of the subtraction unit 10''' containing the operational amplifier 44, the electric reaction of the transducer is directly obtained as an AC signal. In the following synchronous rectifier circuit the multiplier unit 37 performs a phase-preserving rectification of the measurement signal, and the integrating low-pass 38 eliminates the high-frequency multiplication products. Synchronous rectification shifted in phase by 90 degrees will produce the vector part of the phase-shifted signal of the electric reaction. Via a multiplexer 40 and an analog-digital converter 41 the amlitude vectors are fed into the micro-processor 42. They may then be converted into amplitude and phase, and will also be available via the interface 45. If the operational amplifier 44 is used as a charge amplifier at the same time, the measurement values of the transducer may be corrected in the micro-processor 42 by means of a Fourier transformation. The subtraction unit proper again is framed by a broken line and is designated 10'''.

Figure 5:
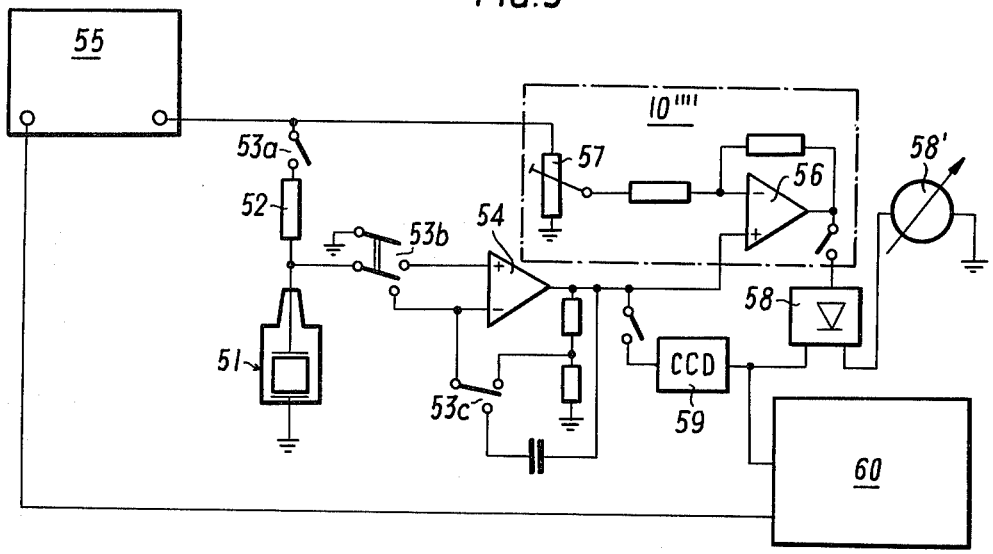
FIG. 5 shows another variant of the invention with a charge amplifier.

FIG. 5 shows a set-up in which measurements with the transducer 51 may be alternated with the determination of the vibration characteristics of the transducer. The AC generator 55 provides an excitation signal which may be applied to the phase-variable impedance chain 52 by contact 53a of switch 53. The response signal of the transducer 51 to be tested is amplified by the operational amplifier 54; another operational amplifier 56 determines the electric reaction of the transducer, i.e. the measurement signal proper, by subtracting a fraction of the excitation signal from the response signal. The measurement signal is rectified by a precision rectifier 58 and is displayed on a voltmeter 58′. By means of a plotter 60, whose one input is supplied with a frequency-proportional voltage from the AC generator 55, a frequency curve of the transducer may be drawn. By tipping switch 53, which contains contacts 53a, 53b, 53c, the operational amplifier 54 will turn into a charge amplifier whose output signal may be stored in a CCD memory 59 triggered internally or externally, or may be recorded by the plotter 60. The subtraction unit proper is designated 10′′′′ in this case.

We claim:

1. Test apparatus for determination of the vibration characteristics of piezoelectric transducers, comprising:
    an AC generator for generating an excitation signal and connected to aa piezoelectric transducer to induce mechanical vibration thereof by the inverse piezoelectric effect induced by said excitation signal;
    measuring means for measurement of said mechanical vibration and including subtraction means having an input connected to the excitation signal of said AC generator and another input responsive to the electrical response signal output of said piezoelectric transducer, and further including a voltage-dividing impedance chain connected to said subtraction means for phase compensating said excitation signal, said piezoelectric transducer forming part of said impedance chain and said electric response signal being derived from said impedance chain, said subtraction means including an operational amplifier having a differentiating input with one input thereof responsive to the output of said AC generator and another input responsive to said electrical response signal; and
    evaluation means responsive to the output of said operational amplifier for deriving a measurement signal from the difference between said electrical response signal and a signal proportional to the AC generator excitation signal.

2. A test apparatus as claimed in claim 1, wherein said impedance chain includes an adjustable impedance element.

3. A test apparaus as claimed in claim 2, wherein one signal lead of said piezoelectric transducer is connected to the housing ground thereof, and said housing ground is connected to the ground of said impedance chain.

4. A test apparatus as claimed in claim 2, wherein said piezoelectric transducer includes two signal leads and wherein said piezoelectric transducer is connected in the voltage source side of said impedance chain which is unilaterally grounded.

5. A test apparatus as claimed in claim 1, wherein said measuring means includes another adjustable voltage-divider circuit connected to said subtraction means for supplying a subtraction voltage to compensate for the electrical reaction of said excitation signal resulting from the parallel resistance of the interconnection of said piezoelectric transducer with said subtraction means.

6. A test apparatus as claimed in claim 5, wherein said another adjustable voltage-divider circuit is adjustable for compensating said electrical reaction of a series of substantially identical piezoelectric transducers, and further comprising an analog/digital converter for digitizing both said excitation signal and said electrical response signal, and further comprising digital processing means responsive to the output of said analog/digital converter for further compensating said electrical reaction of said electrical response signal.

7. A test apparatus as claimed in claim 1, wherein said subtraction means is configured as a bridge circuit, and wherein said piezoelectric transducer and another substantially identical piezoelectric transducer are each connected in a branch of said bridge circuit to compensate the electrical reaction of said electrical response signal, and wherein the environmental conditions of the operation of said piezoelectric transducer can be varied to simulate different operational conditions thereof.

8. A test apparatus as claimed in claim 1, wherein the charge amplifier normally used with said piezoelectric transducer during normal operation thereof forms a direct part of said subtraction means.

9. A test apparatus as claimed in claim 1, wherein said measuring means is integrally formed with said piezoelectric transducer.

10. A test apparatus as claimed in claim 1, wherein said measuring means further includes microprocessor means for controlling said evaluation means.

* * * * *